United States Patent
Kotani et al.

(10) Patent No.: US 8,592,823 B2
(45) Date of Patent: Nov. 26, 2013

(54) COMPOUND SEMICONDUCTOR DEVICE AND METHOD FOR MANUFACTURING THE SAME

(75) Inventors: Junji Kotani, Isehara (JP); Tetsuro Ishiguro, Kawasaki (JP); Shuichi Tomabechi, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/548,324

(22) Filed: Jul. 13, 2012

(65) Prior Publication Data

US 2013/0043489 A1 Feb. 21, 2013

(30) Foreign Application Priority Data

Aug. 18, 2011 (JP) .................................. 2011-178957

(51) Int. Cl.
*H01L 29/20* (2006.01)
(52) U.S. Cl.
USPC 257/76; 257/77; 257/E29.089; 257/E21.086; 257/E21.097; 438/46; 438/47
(58) Field of Classification Search
USPC .......................... 257/E21.086, E21.097–21.1, 257/E21.108–E21.113, E21.117–E21.118, 257/E21.542, E21.543, E21.697–E21.699; 438/46, 47, 77, 84, 93–95, 102, 104, 438/188, 189, 285, 603–604, 606, 930–933
See application file for complete search history.

(56) References Cited

U.S. PATENT DOCUMENTS

| | | | |
|---|---|---|---|
| 2010/0148174 A1 | 6/2010 | Nakahata et al. | |
| 2010/0244098 A1 | 9/2010 | Yokoyama | |
| 2011/0198590 A1* | 8/2011 | Preble et al. | 257/49 |
| 2011/0220867 A1* | 9/2011 | Khan et al. | 257/13 |
| 2011/0260216 A1* | 10/2011 | Hebert | 257/194 |

FOREIGN PATENT DOCUMENTS

| | | |
|---|---|---|
| JP | 2010-228967 A1 | 10/2010 |
| JP | 2011-119715 A1 | 6/2011 |
| KR | 10-2010-0057756 | 6/2010 |

OTHER PUBLICATIONS

Notice of Preliminary Rejection mailed Jul. 10, 2013 from the Korean Intellectual Property Office in counterpart application No. 10-2012-86112 with English translation.

* cited by examiner

*Primary Examiner* — Mamadou Diallo
(74) *Attorney, Agent, or Firm* — Kratz, Quintos & Hanson, LLP (57) ABSTRACT

A compound semiconductor device includes: a substrate; a GaN compound semiconductor multilayer structure disposed over the substrate; and a stress relief layer which is AlN-based and which is disposed between the substrate and the GaN compound semiconductor multilayer structure, wherein a surface of the stress relief layer that is in contact with the GaN compound semiconductor multilayer structure includes recesses that have a depth of 5 nm or more and that are formed at a number density of $2\times10^{10}$ cm$^{-2}$ or more.

10 Claims, 10 Drawing Sheets

FIG. 3A    Rsk > 0

FIG. 3B    Rsk = 0

FIG. 3C    Rsk < 0

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2011-178957, filed on Aug. 18, 2011, the entire contents of which are incorporated herein by reference.

FIELD

The embodiments discussed herein are related to a compound semiconductor device and a method for manufacturing the same.

BACKGROUND

In recent years, electronic devices (compound semiconductor devices) in which GaN layers and AlGaN layers are sequentially arranged over substrates and in which the GaN layers are used as electron travel layers have been under active development. One of such compound semiconductor devices is a GaN high-electron mobility transistor (HEMT). The use of the GaN HEMT as a switch for inverters for power supplies enables both the reduction of on-resistance and the enhancement of dielectric strength. Furthermore, the GaN HEMT may reduce standby power consumption and may increase operating frequencies as compared with Si transistors. These enable the reduction of switching loss and the reduction in power consumption of inverters. GaN HEMTs enable downsizing as compared with Si transistors equivalent in performance to the GaN HEMTs.

In a GaN HEMT including a GaN layer used as an electron travel layer and an AlGaN layer used as an electron supply layer, strain due to the difference in lattice constant between AlGaN and GaN is caused in the AlGaN layer. Therefore, piezoelectric polarization occurs and a high-concentration two-dimensional electron gas (2DEG) is obtained. Accordingly, the GaN HEMT is suitable for high-power device applications.

However, it is very difficult to produce a GaN substrate with good crystallinity. Therefore, for example, conventional GaN compound semiconductor layers such as GaN layers and AlGaN layers have been formed mainly over a Si substrate, a sapphire substrate, or a SiC substrate by heteroepitaxial growth. In particular, large-size, high-quality Si substrates are readily available at low cost. Therefore, structures formed by growing GaN layers and AlGaN layers over a Si substrate are under active investigation.

However, there are large differences in thermal expansion coefficient between a GaN layer, an AlGaN layer, and a Si substrate. On the other hand, high-temperature treatment is used to epitaxially grow the GaN layer and the AlGaN layer. Therefore, the Si substrate becomes warped or cracked due to a difference in thermal expansion coefficient during such high-temperature treatment in some cases. In order to solve problems caused by such a difference in thermal expansion coefficient, the following technique is being studied: a technique for providing buffer layers, having a super-lattice structure in which two-types of compound semiconductor layers different in composition from each other are alternately stacked, between a GaN layer, an AlGaN layer, and a Si substrate.

However, in conventional compound semiconductor devices including buffer layers having a super-lattice structure, it is difficult to sufficiently suppress cracking, warpage, and the like. Furthermore, it is difficult to allow an electron travel layer and electron supply layer formed on such a super-lattice structure to have good crystallinity.

The following technique is also being studied: a technique for forming a layer having a thermal expansion coefficient close to that of a GaN compound semiconductor layer on the back surface of an Si substrate. However, for this conventional technique, warpage or the like occurs when this layer is formed. Since the occurrence of such warpage causes variations in substrate temperature during the formation of an electron travel layer and an electron supply layer, it is difficult to obtain desired properties. Japanese Laid-Open Patent Publication Nos. 2010-228967 and 2011-119715 are examples of related art.

SUMMARY

According to an aspect of the embodiments, a compound semiconductor device includes: a substrate; a GaN compound semiconductor multilayer structure disposed over the substrate; and a stress relief layer which is AlN-based and which is disposed between the substrate and the GaN compound semiconductor multilayer structure, wherein a surface of the stress relief layer that is in contact with the GaN compound semiconductor multilayer structure includes recesses that have a depth of 5 nm or more and that are formed at a number density of $2 \times 10^{10}$ cm$^{-2}$ or more.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments are described in detail with reference to the attached drawings.

(First Embodiment)

Figure 1:
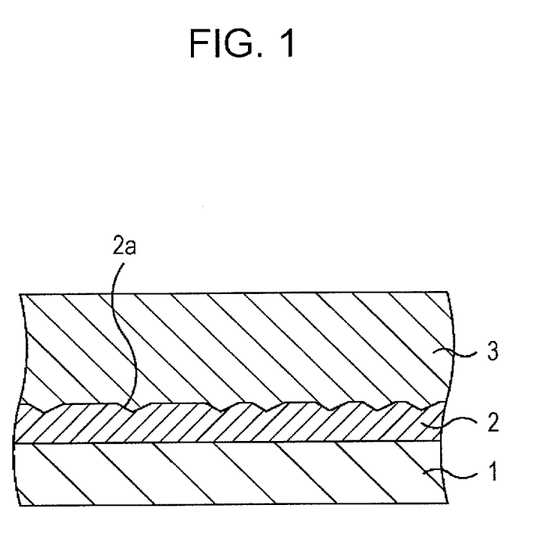
FIG. 1 is an illustration depicting the configuration of a compound semiconductor device according to a first embodiment.

A first embodiment will now be described. FIG. 1 is an illustration depicting the configuration of a compound semiconductor device according to the first embodiment.

In the first embodiment, as illustrated in FIG. 1, a stress relief layer 2 is disposed on a substrate 1 and a compound semiconductor multilayer structure 3 which is GaN-based is disposed on the stress relief layer 2. The substrate 1 is, for example, an Si (111) substrate. The stress relief layer 2 is, for example, an AlN-based compound semiconductor layer such as an AlN layer. The upper surface of the stress relief layer 2 has recesses 2a, arranged at a number density of $2 \times 10^{10}$ cm$^{-2}$ or more, having a depth of 5 nm or more. The compound semiconductor multilayer structure 3 includes, for example, an electron travel layer and an electron supply layer. Furthermore, for example, a gate electrode, a source electrode, and a drain electrode are arranged on the electron supply layer such that the gate electrode is sandwiched between the source electrode and the drain electrode.

Figure 2A:
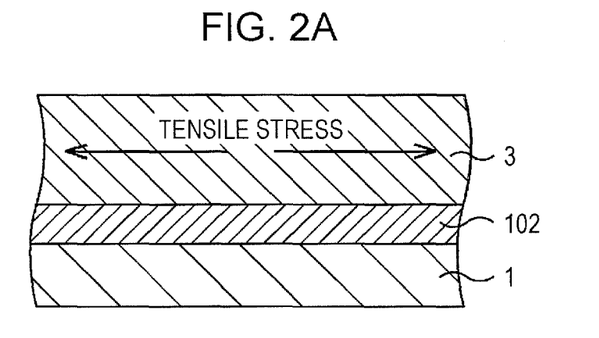
FIGS. 2A and 2B are illustrations depicting the action of the compound semiconductor device according to the first embodiment.

In conventional techniques, an AlN layer is formed between a substrate and an electron travel layer such as GaN layer in some cases. The upper surface of such an AlN layer is flat. In the case of forming an AlN layer 102 having a flat upper surface instead of the stress relief layer 2 as illustrated in FIG. 2A, a large tensile stress due to the difference in thermal expansion coefficient between the substrate 1 and the compound semiconductor multilayer structure 3, which is GaN-based, acts on the compound semiconductor multilayer structure 3 during cooling subsequent to the growth of the compound semiconductor multilayer structure 3. This results in that the compound semiconductor multilayer structure 3 is cracked or the substrate 1 is warped.

Figure 2B:
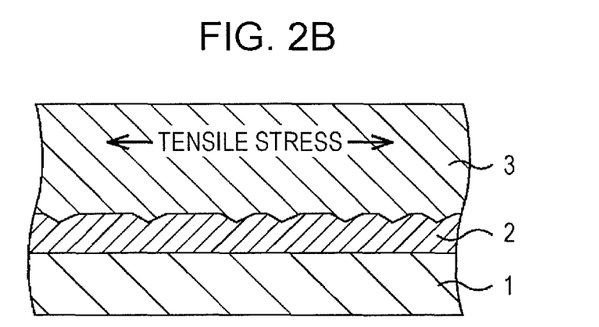

In contrast, in this embodiment, the recesses 2a are appropriately scattered in the upper surface of the stress relief layer 2. Therefore, portions grown from walls of the recesses 2a butt against each other during the growth of the compound semiconductor multilayer structure 3 to generate compressive stress. Therefore, local compressive stress is generated in a nitride semiconductor layer grown on the stress relief layer 2, which has the recesses 2a, to act on the compound semiconductor multilayer structure 3. Thus, the tensile stress generated in the compound semiconductor multilayer structure 3 during cooling subsequent to growth is compensated, whereby the cracking of the compound semiconductor multilayer structure 3, the warpage of the substrate 1, and the like are suppressed. Furthermore, no particularly complicated control or no long-term crystal growth is performed to obtain such a configuration. Therefore, an increase in cost may be suppressed.

Figure 3A:
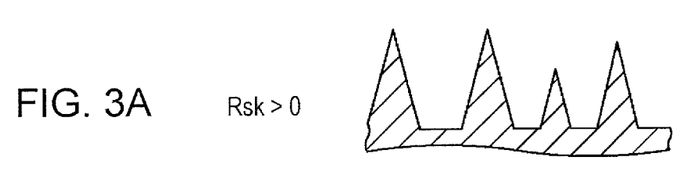
FIGS. 3A to 3C are illustrations depicting the relationship between surface profile and skewness Rsk.
Figure 3B:
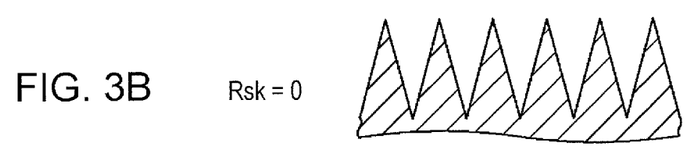
Figure 3C:
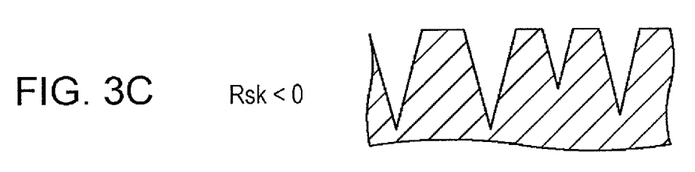

As for the surface profile of the stress relief layer 2, the skewness Rsk of a roughness curve is negative. When the skewness Rsk of the roughness curve is positive, the surface profile thereof is that a plurality of protrusions protruding from a reference plane are present as illustrated in FIG. 3A. When the skewness Rsk of the roughness curve is 0, the surface profile thereof is that substantially an equal number of protrusions and recesses are present as illustrated in FIG. 3B. When the skewness Rsk of the roughness curve is negative, the surface profile thereof is that a plurality of recesses recessed from a reference plane are present as illustrated in FIG. 3C.

The reason why recesses to be measured for number density are the recesses 2a, which have a depth of 5 nm or more, is that very little compressive stress is generated around recesses having a depth of less than 5 nm and such recesses hardly contribute to the relief of tensile stress. The reason why the number density of the recesses 2a is set to $2 \times 10^{10}$ cm$^{-2}$ or more is that when the number density thereof is less than $2 \times 10^{10}$ cm$^{-2}$, compressive stress is insufficient and it is difficult to sufficiently relieve tensile stress. In consideration of results of experiments performed by the inventor as described below, it is preferred that the recesses 2a have a depth of 6 nm or more and are arranged at a number density of $2 \times 10^{10}$ cm$^{-2}$ or more, it is more preferred that the recesses 2a have a depth of 7 nm or more and are arranged at a number density of $8 \times 10^{9}$ cm$^{-2}$ or more, and it is further more preferred that the recesses 2a have a depth of 15 nm or more and are arranged at a number density of $9 \times 10^{9}$ cm$^{-2}$ or more. The diameter of the recesses 2a substantially depends on the depth thereof. In consideration of results of experiments performed by the inventor, the recesses 2a, which have a depth of 5 nm or more, preferably have a diameter of 30 nm or more and more preferably 80 nm or more. The upper limit of the diameter of the recesses 2a is not particularly limited as long as the number density may be ensured. When the depth of the recesses 2a is too large with respect to the diameter thereof, the recesses 2a may possibly be incapable of being filled with a buffer layer formed thereon or the buffer layer may possibly have disrupted crystallinity. Therefore, the depth of the recesses 2a is preferably 50 nm or less.

A compound semiconductor device in the first embodiment includes a stress relief layer having appropriate recesses and therefore may suppress cracking or the like due to the difference in thermal expansion coefficient between materials.

(Second Embodiment)

Figure 4A:
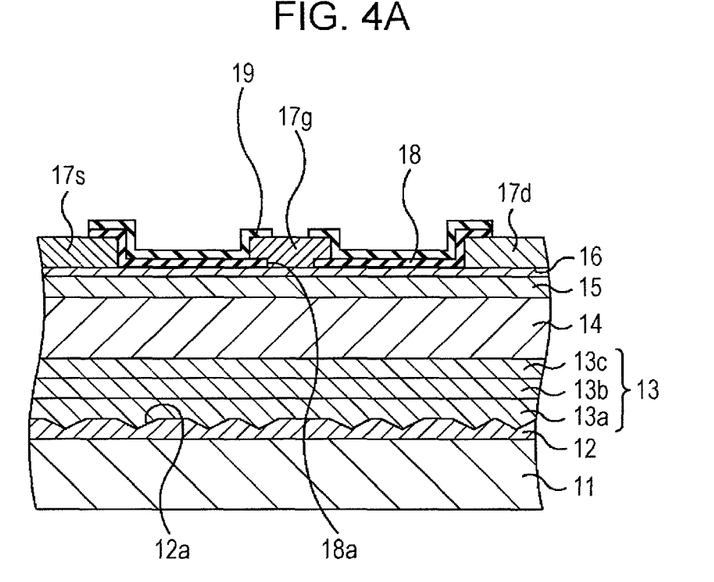
FIGS. 4A and 4B are illustrations depicting the configuration of a GaN HEMT according to a second embodiment.
Figure 4B:
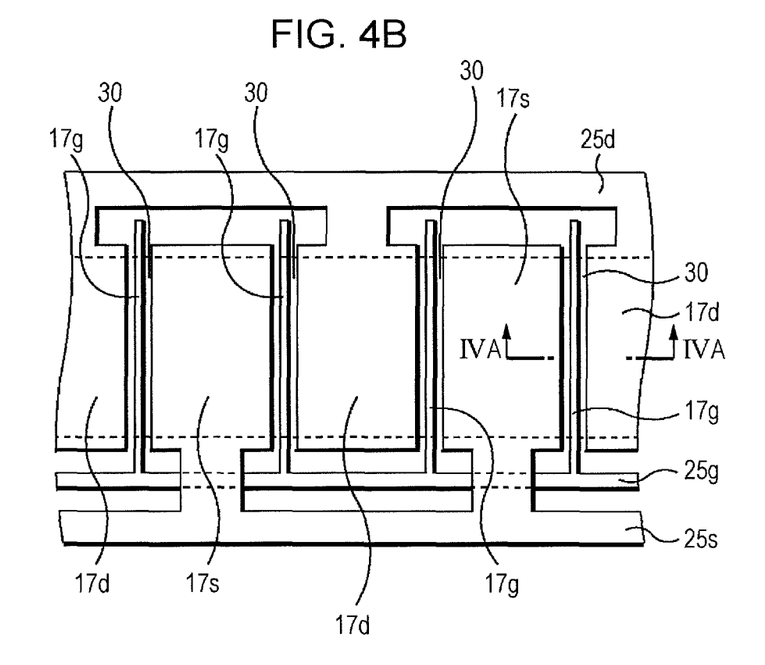

A second embodiment is described below. FIGS. 4A and 4B are illustrations depicting the configuration of a GaN HEMT (compound semiconductor device) according to the second embodiment.

In the second embodiment, as illustrated in FIG. 4A, a stress relief layer 12 having a thickness of about 50 nm to 300 nm (for example, 200 nm) is disposed on a substrate 11 such as an Si (111) substrate. The stress relief layer 12 is, for example, an AlN compound semiconductor layer such as an AlN layer. The upper surface of the stress relief layer 12 has recesses 12a, arranged at a number density of $2 \times 10^{10}$ cm$^{-2}$ or more, having a depth of 5 nm or more. A buffer layer 13 is disposed on the stress relief layer 12. The buffer layer 13 includes an AlGaN sub-layer 13a having a thickness of about 50 nm to 300 nm (for example, 200 nm), an AlGaN sub-layer 13b having a thickness of about 50 nm to 300 nm (for example, 200 nm), and an AlGaN sub-layer 13a having a thickness of about 50 nm to 300 nm (for example, 200 nm). The AlGaN sub-layer 13a has a composition represented by the formula $Al_xGa_{1-x}N$, where $0<x\leq1$. The AlGaN sub-layer 13b has a composition represented by the formula $Al_yGa_{1-y}N$, where $0\leq y\leq1$. The AlGaN sub-layer 13c has a composition represented by the formula $Al_zGa_{1-z}N$, where $0\leq z<1$. For x, y, and z, the relationship x>y>z holds. For example, x (the Al composition of the AlGaN sub-layer 13a) is 0.8, y (the Al composition of the AlGaN sub-layer 13b) is 0.5, and z (the Al composition of the AlGaN sub-layer 13c) is 0.2.

An electron travel layer 14 is disposed on the buffer layer 13. An electron supply layer 15 is disposed on the electron travel layer 14. A protective layer 16 is disposed on the electron supply layer 15. The electron travel layer 14 is, for example, a GaN layer and has a thickness of about 0.5 μm to 1.5 μm (for example, 1 μm). The electron supply layer 15 is, for example, an n-type AlGaN layer and has a thickness of about 10 nm to 30 nm (for example, 30 nm). This AlGaN layer has a composition represented by, for example, the formula $Al_{0.25}Ga_{0.75}N$. The protective layer 16 is, for example, an n-type GaN layer and has a thickness of about 2 nm to 15 nm (for example, 10 nm). The n-type AlGaN and GaN layers are doped with an n-type impurity such as Si at a concentration of about $1 \times 10^{18}$ cm$^{-3}$ to $1 \times 10^{20}$ cm$^{-3}$ (for example, $5 \times 10^{18}$ cm$^{-3}$).

Source electrodes 17s and drain electrodes 17d are disposed on the protective layer 16. The source electrodes 17s and the drain electrodes 17d are in ohmic contact with the protective layer 16. The source electrodes 17s and the drain electrodes 17d each include, for example, a Ti film and an Al film disposed thereon. A passivation film 18 is disposed on the protective layer 16 and covers the source electrode 17s and the drain electrode 17d. The passivation film 18 is, for example, a silicon nitride film. The passivation film 18 has opening portions 18a, located between the source electrodes 17s and the drain electrodes 17d, for gate electrodes. Gate electrodes 17g are disposed on the passivation film 18 and extend through the opening portions 18a to be in Schottky contact with the protective layer 16. The gate electrodes 17g each include, for example, an Ni film and an Au film disposed thereon. A passivation film 19 is disposed on the passivation film 18 and covers the gate electrodes 17g. The passivation film 19 is, for example, a silicon nitride film. The passivation films 18 and 19 have openings for connecting external terminals and the like.

The layout of the substrate 11 is as illustrated in, for example, FIG. 4B when viewed from the surface side. The gate electrodes 17g, the source electrodes 17s, and the drain electrodes 17d are interdigitally arranged in plan view, that is, the source electrodes 17s and the drain electrodes 17d are alternately arranged and the gate electrodes 17g are arranged therebetween. The gate electrodes 17g are commonly connected through a gate line 25g. The source electrodes 17s are commonly connected through a source line 25s. The drain electrodes 17d are commonly connected through a drain line 25d. The use of such a multi-finger gate configuration allows an increase in power. FIG. 4A is a sectional view taken along the line IVA-IVA of FIG. 4B. The electron travel layer 14, the electron supply layer 15, the protective layer 16, and the like are contained in an active region 30. The active region 30 is surrounded by an inactive region formed by ion implantation, mesa etching, or the like.

In the GaN HEMT, which is configured as described above, a high concentration of carriers due to piezoelectric polarization are generated at the heterojunction interface between GaN making up the electron travel layer 14 and AlGaN making up the electron supply layer 15. That is, electrons are induced near the interface between the electron travel layer 14 and the electron supply layer 15 by a piezoelectric effect due to lattice mismatch.

In the second embodiment, the recesses 12a are appropriately scattered in the upper surface of the stress relief layer 12; hence, compressive stress locally acts on a compound semiconductor multilayer structure including the electron travel layer 14, the electron supply layer 15, and the protective layer 16 in addition to tensile stress during cooling subsequent to the growth of the compound semiconductor multilayer structure. Thus, tensile stress is compensated and therefore the cracking of the compound semiconductor multilayer structure, the warpage of the substrate 11, and the like are suppressed.

A method for manufacturing the GaN HEMT (compound semiconductor device) according to the second embodiment is described below. FIGS. 5A to 5D are sectional views sequentially illustrating operations of the method for manufacturing the GaN HEMT (compound semiconductor device) according to the second embodiment.

Figure 5A:
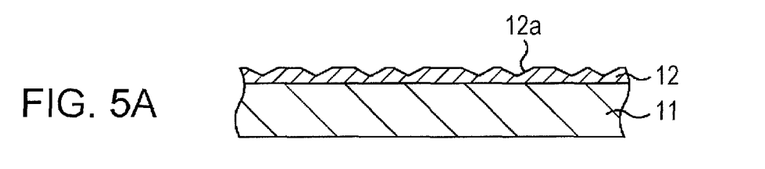
FIGS. 5A to 5D are sectional views sequentially illustrating operations of a method for manufacturing the GaN HEMT according to the second embodiment.

As illustrated in FIG. 5A, the stress relief layer 12 is formed on the substrate 11 so as to have the recesses 12a, which are dispersed at a number density of $2 \times 10^{10}$ cm$^{-2}$ or more and have a depth of 5 nm or more. The stress relief layer 12 may be formed by, for example, a crystal growth technique such as metal-organic vapor phase epitaxy (MOVPE) or molecular beam epitaxy (MBE). In the case of forming the stress relief layer 12, which is an AlN layer, by MOVPE, trimethyl aluminum (TMAl) is used as a source of aluminum (Al) and ammonia (NH$_3$) is used as a source of nitrogen (N). The V/III ratio that is the molar ratio of TMAl to NH$_3$ is adjusted to 50 or more, more preferably 100 or more, and further more preferably 200 or more; the growth temperature is adjusted to about 1,080° C.; and the growth rate is adjusted to about 500 nm/h. Alternatively the V/III ratio is adjusted to about 10 to 100, the growth temperature is adjusted to about 1,000° C. to 1,040° C., and the growth rate is adjusted to about 500 nm/h. If the recesses 12a may be formed at a number density of $2 \times 10^{10}$ cm$^{-2}$ or more, a method for forming the stress relief layer 12 is not particularly limited.

Figure 5B:
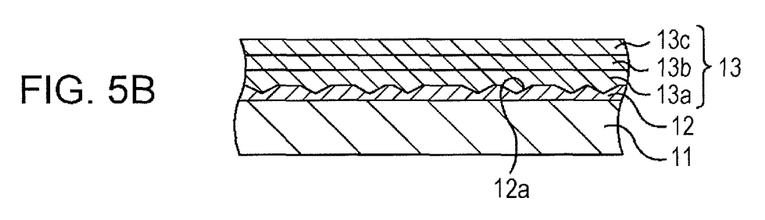
Figure 5C:
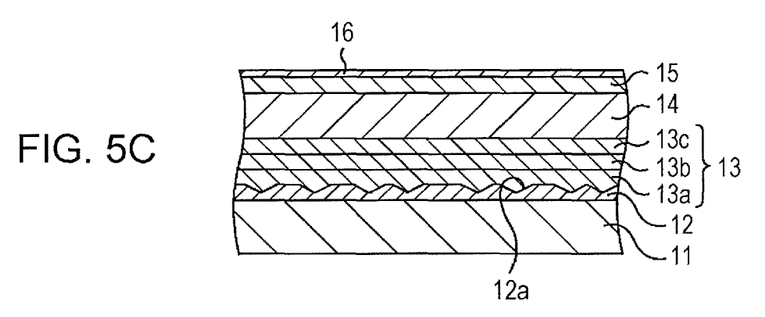

After the stress relief layer 12 is formed, the buffer layer 13 is formed on the stress relief layer 12 so as to include the AlGaN sub-layers 13a, 13b, and 13c as illustrated in FIG. 5B. Furthermore, as illustrated in FIG. 5C, the electron travel layer 14, the electron supply layer 15, and the protective layer 16 are formed on the buffer layer 13. These compound semiconductor layers, as well as the stress relief layer 12, may be formed by a crystal growth technique such as MOVPE or MBE. In this case, for example, trimethyl gallium (TMGa) may be used as a source of gallium (Ga). For example, silane (SiH$_4$) may be used as a source of silicon (Si), which is contained as an n-type impurity. A zone ranging from the stress relief layer 12 to the protective layer 16 may be continuously formed by selecting source gases.

In this embodiment, at least the upper surface of the electron travel layer 14 is flat. If the upper surface of the electron travel layer 14 may be made flat, the buffer layer 13 may be formed such that the upper surface of the buffer layer 13 has recesses following the recesses 12a or is flat without having such recesses following the recesses 12a. In the case where the buffer layer 13 or the electron travel layer 14 is formed so as to have a flat surface, the V/III ratio is set to, for example, about 20 or less. The growth of crystals under such conditions promotes the migration of Al atoms and N atoms at a growth front; hence, the growth front becomes flat.

Figure 5D:
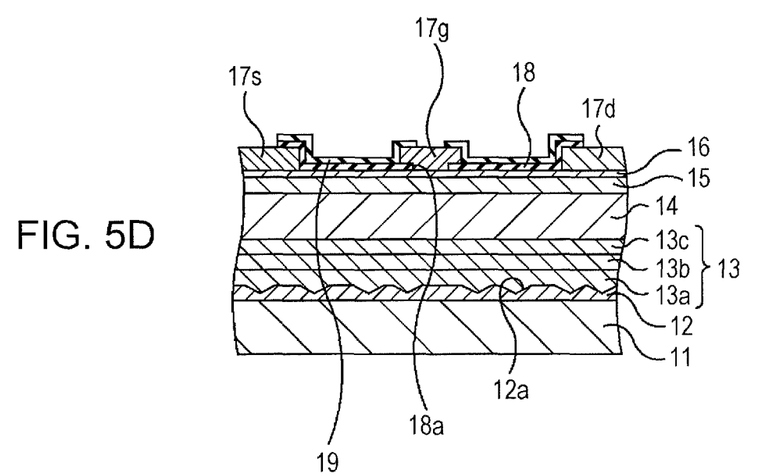

After the protective layer 16 is formed, the source electrodes 17s and the drain electrodes 17d are formed on the protective layer 16 by, for example, a lift-off process as illustrated in FIG. 5D. In the formation of the source electrodes 17s and the drain electrodes 17d, a resist pattern having openings corresponding to regions for forming the source electrodes 17s and the drain electrodes 17d is formed, Ti and Al are vapor-deposited, and the resist pattern is then removed together with Ti and Al deposited thereon, whereby the source electrodes 17s and the drain electrodes 17d, in which Ti and Al are layered, are formed. Heat treatment is performed at a temperature of 400° C. to 1,000° C. (for example, 600° C.) in a nitrogen atmosphere, whereby ohmic contact is established.

As illustrated in FIG. 5D, the passivation film 18 is formed on the protective layer 16 so as to cover the source electrodes 17s and the drain electrodes 17d. The passivation film 18 is, for example, a silicon nitride film formed by a plasma-enhanced chemical vapor deposition (CVD) process.

A resist pattern having openings corresponding to regions for forming the opening portions 18a is formed. Subsequently, the opening portions 18a are formed in the passivation film 18 by etching using this resist pattern as illustrated in FIG. 5D. The gate electrodes 17g are then formed on the passivation film 18 by a lift-off process so as to be in contact with the protective layer 16 through the opening portions 18a. In the formation of the gate electrodes 17g, after the resist pattern used to form the opening portions 18a is removed, another resist pattern having openings corresponding to regions for forming the gate electrodes 17g is formed, Ni and Au are vapor-deposited, and this resist pattern is then removed together with Ni and Au deposited thereon, whereby the gate electrodes 17g, in which Ni and Au are layered, are formed.

As illustrated in FIG. 5D, the passivation film 19 is formed on the protective layer 18 so as to cover the gate electrodes 17g. The passivation film 19 is, for example, a silicon nitride film formed by a plasma-enhanced CVD process.

Subsequently, the following lines are formed (see FIG. 4B): the gate line 25g, which commonly connecting the gate electrodes 17g, the source line 25s, which commonly connecting the source electrodes 17s, the drain line 25d, which commonly connecting the drain electrodes 17d, and the like. This allows the GaN HEMT to be obtained as illustrated in FIG. 4A.

Figure 6:
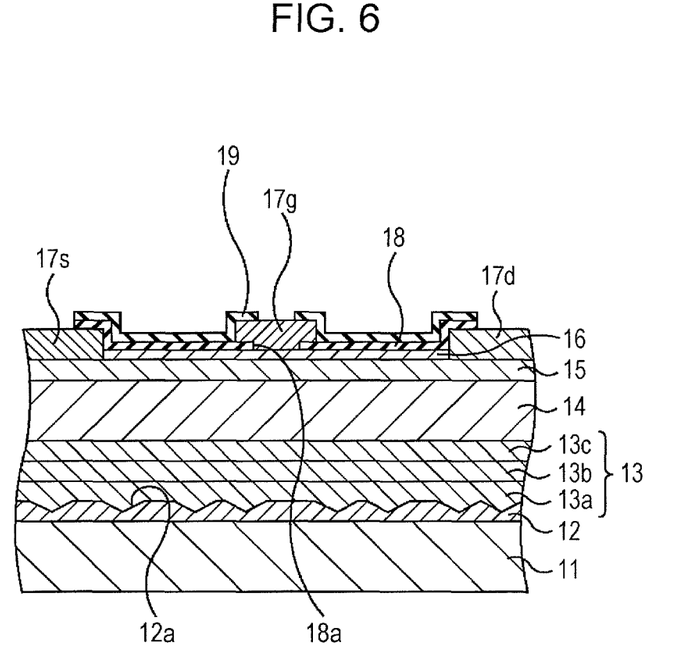
FIG. 6 is a sectional view illustrating a modification of the second embodiment.

As illustrated in FIG. 6, openings for the source and drain electrodes 17s and 17d may be formed in the protective layer 16 such that the source and drain electrodes 17s and 17d are in contact with the electron supply layer 15. In this case, regarding the depth of these openings, portions of the protective layer 16 may be left or portions of the electron supply layer 15 may be removed. That is, the depth of these openings does not have to coincide with the thickness of the protective layer 16.

A monolithic microwave integrated circuit (MMIC) may be obtained by mounting a resistor, a capacitor, and the like on the substrate 11.

Figure 7:
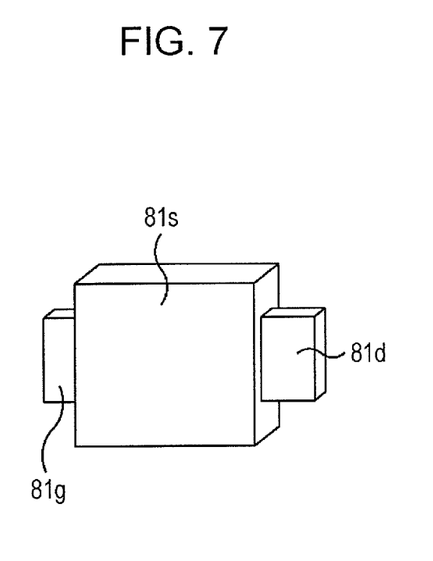
FIG. 7 is an illustration depicting an example of the appearance of a high-power amplifier.

The GaN HEMT according to this embodiment may be used as, for example, a high-power amplifier. FIG. 7 illustrates an example of the appearance of the high-power amplifier. In this example, a source terminal 81s connected to a gate electrode is disposed on a surface of a package. A gate terminal 81g connected to a gate electrode and a drain terminal 81d connected to a drain electrode extend from side surfaces of the package.

Figure 8A:
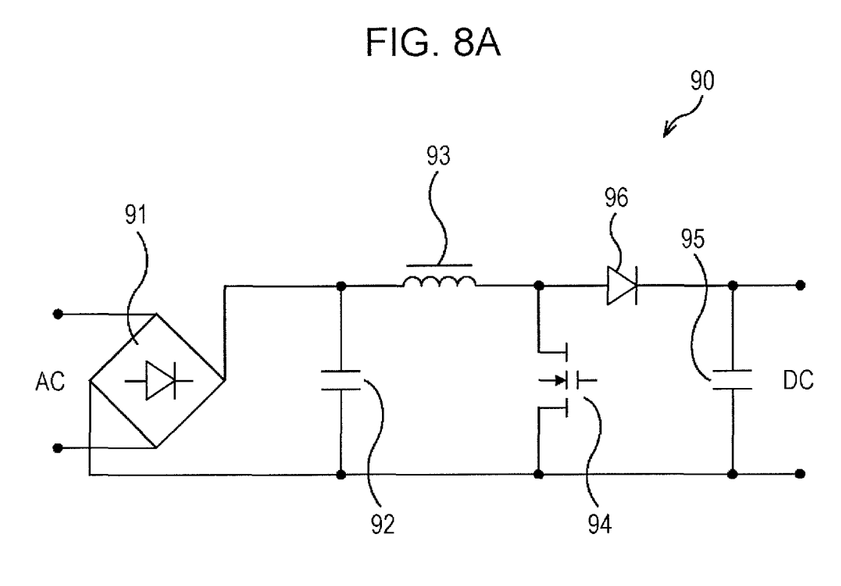
FIGS. 8A and 8B are illustrations depicting power supply systems.
Figure 8B:
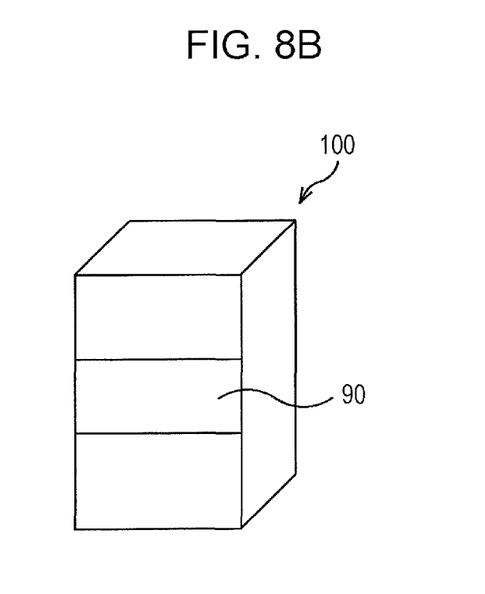

The GaN HEMT according to this embodiment may be used for, for example, power supply systems. FIG. 8A is a diagram of a power factor correction (PFC) circuit. FIG. 8B is an illustration of a server power supply (power supply system) including the PFC circuit illustrated in FIG. 8A.

As illustrated in FIG. 8A, the PFC circuit 90 includes a diode bridge 91 having an output port and an input port connected to an alternating-current (AC) power supply and also includes a capacitor 92 connected to the output port of the diode bridge 91. The capacitor 92 includes a terminal connected to a terminal of a choke coil 93. The choke coil 93 includes a terminal connected to a terminal of a switching element 94 and also includes a terminal connected to the anode of a diode 96. The switching element 94 includes the GaN HEMT according to this embodiment. The terminal of the switching element 94 that is connected to the choke coil 93 corresponds to a source electrode of the GaN HEMT. The cathode of the diode 96 is connected to a terminal of a capacitor 95. Another terminal of the capacitor 92, this terminal of the switching element 94, and another terminal of the capacitor 95 are grounded. A direct-current (DC) power supply is taken out between both terminals of the capacitor 95.

As illustrated in FIG. 8B, the PFC circuit 90 is incorporated in the server power supply 100 or the like and is used.

A power supply system enabling high-speed operation may be configured like the server power supply 100. A switching element similar to the switching element 94 may be used in a switching power supply or an electronic device. These semiconductor devices may be used as components for full-bridge power supply circuits such as power supply circuits for servers.

In this embodiment, the following substrate may be used: a silicon carbide (SiC) substrate, a sapphire substrate, a silicon substrate, a GaN substrate, or a GaAs substrate. A substrate used herein may be conductive, semi-insulating, or insulating. In consideration of cost, an Si substrate, an SiC substrate, or a sapphire substrate is preferably used.

The configuration of the gate electrodes 17g, the source electrodes 17s, and the drain electrodes 17d is limited to that described in this embodiment. These electrodes may have, for example, a single-layer structure. A method for forming these electrodes is not limited to a lift-off process. If ohmic properties are obtained, heat treatment subsequent to the formation of the source electrodes 17s and the drain electrodes 17d may be omitted. The gate electrodes 17g may be heat-treated.

Before the gate electrodes 17g are formed, recessed portions may be formed by partly or entirely etching the protective layer 16. In this case, the recessed portions may be formed so as to extend to intermediate portions of the electron supply layer 15. A gate insulating layer may be formed between the gate electrodes 17g and the protective layer 16. Furthermore, the buffer layer 13 may be a super-lattice buffer layer or the like.

The thickness of each layer and a material for forming the layer are not limited to those described in this embodiment.

Experiments performed by the inventor are described below. In the experiments, as well as the second embodiment, stress relief layers 12 (AlN layers) were grown on substrates 11 with a diameter of 6 inches under 4 types of conditions. A buffer layer 13, an electron travel layer 14, an electron supply layer 15, and a protective layer 16 were grown on each stress relief layer 12 in that order and were then cooled as described in the second embodiment. The growth of the stress relief layer 12 (AlN layer) to the protective layer 16 was continuously performed. However, in Condition No. 1, an AlN layer having a flat surface was grown instead of the stress relief layer 12. The V/III ratio used to form the AlN layer was about 2. The V/III ratio used to form the stress relief layer 12 (AlN layer) under Condition No. 2 was about 50. The V/III ratio used to form the stress relief layer 12 (AlN layer) under Condition No. 3 was about 100. The V/III ratio used to form the stress relief layer 12 (AlN layer) under Condition No. 4 was about 200. Other conditions were common.

Figure 9A:
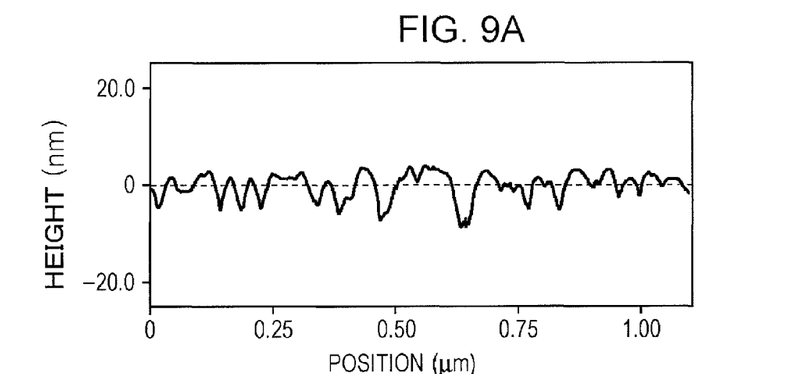
FIGS. 9A to 9C are graphs illustrating results obtained by analyzing the surface profile of stress relief layers.
Figure 9B:
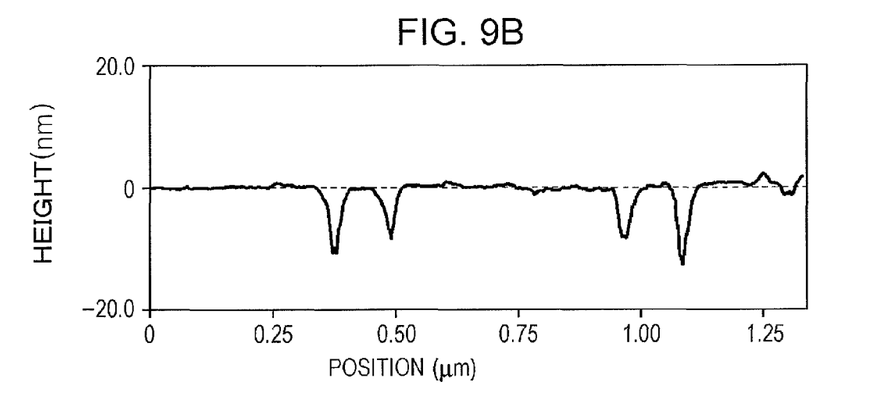
Figure 9C:
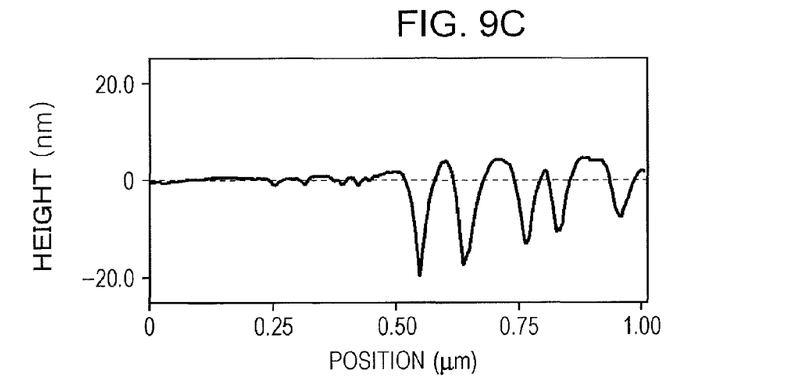

The surface profile of the stress relief layers 12 (AlN layers) formed under Condition Nos. 2 to 4 was analyzed from images taken with an atomic force microscope (AFM) before the buffer layers 13 and the like were formed. Results obtained analyzing portions of samples are illustrated in FIGS. 9A to 9C. In FIGS. 9A to 9C, the vertical axis indicate height differences of the surfaces of the samples. FIG. 9A illustrates results of Condition No. 2. FIG. 9B illustrates results of Condition No. 3. FIG. 9C illustrates results of Condition No. 4. The depth distribution, diameter distribution, and number density of recesses, present in each sample, having a depth of 5 nm or more were measured. Obtained results are summarized as below.

In the Condition No. 1 in which the V/III ratio is about 2, the depth distribution is 0 nm, the maximum depth is 0 nm, the diameter distribution is 0 nm, and the number density is 0 cm$^{-2}$. In the Condition No. 2 in which the V/III ratio is about 50, the depth distribution is 6 nm to 7 nm, the maximum depth is 7 nm, the diameter distribution is about 30 nm, and the number density is $2\times10^{10}$ cm$^{-2}$. In the Condition No. 3 in which the V/III ratio is about 100, the depth distribution is 7 nm to 10 nm, the maximum depth is 10 nm, the diameter distribution is 60 nm to 80 nm, and the number density is $8\times10^9$ cm$^{-2}$. In the Condition No. 4 in which the V/III ratio is about 200, the depth distribution is 15 nm to 20 nm, the maximum depth is 20 nm, the diameter distribution is 80 nm to 100 nm, and the number density is $9\times10^9$ cm$^{-2}$.

Furthermore, the magnitude (warpage value) of the warpage of the sample and the length of cracks present in the sample were measured. The relationships between the maximum depth of the recesses, the magnitude of the warpage thereof, and the length of the cracks are illustrated in FIGS. 10A and 10B.

Figure 10A:
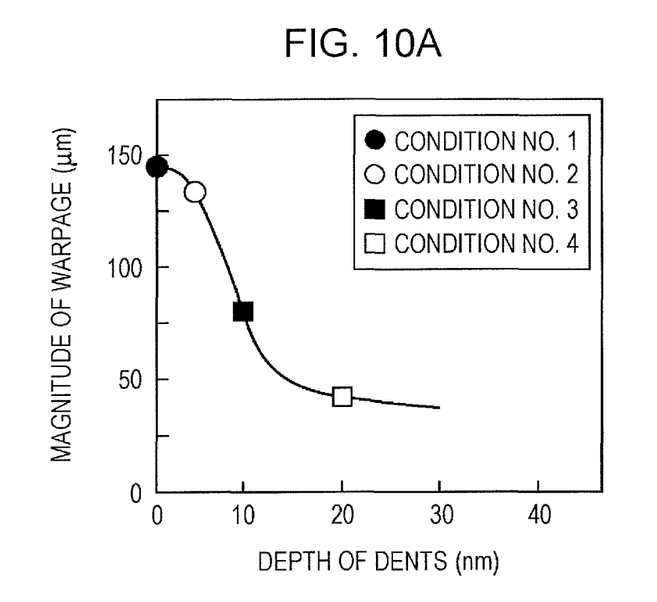
FIGS. 10A and 10B are graphs illustrating the relationship between the depth of recesses, the magnitude of warpage, and the length of cracks.
Figure 10B:
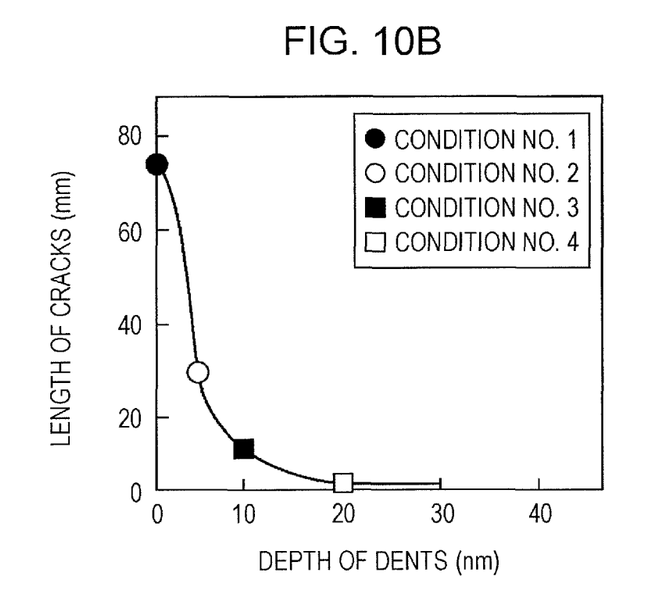

As illustrated in FIGS. 10A and 10B, in Condition No. 1 in which the V/III ratio is very small, about 2, and no recesses are present in a surface of the AlN layer, the magnitude of the warpage of the substrate is about 150 μm and cracks extend from the outer edge of the substrate and have a length of about 75 mm. In contrast, in Condition No. 2 in which the V/III ratio is about 50, appropriate recesses are formed and the length of cracks is half or less of that in Condition No. 1, about 30 mm. In Condition No. 3 in which the V/III ratio is further increased and appropriate recesses are formed, the warpage is reduced. In Condition No. 4 in which the V/III ratio is still further increased and appropriate recesses are formed, the length of cracks is 2 mm or less, about 1 mm, that is, very little cracks are present. Furthermore, the magnitude of the warpage is 50 μm or less, about 40 μm, that is, the warpage is significantly reduced.

Furthermore, the inventor has investigated an AlN layer which has a surface having bumpy irregularities and which has positive skewness. The results are described below. The density of the bumpy irregularities is substantially the same as that of an AlN layer having negative skewness. However, in the AlN layer having positive skewness, the effect of reducing warpage and cracking is not sufficiently obtained. Even in a surface having positive skewness, growth occurs from sloped side surfaces of protruding irregularities generating compressive stress. However, in the case of planarizing a bumpy surface, for example, a growth condition (V/III ratio) is reduced to about 50. This results in a growth mode in which bump side surfaces are gradually planarized with the progress of growth. Accordingly, it is believed that the effect of allowing sloped side surfaces having a profile with negative skewness to mutually generate compressive stress is significantly impaired and the effect of suppressing warpage and cracking is not sufficiently obtained in the case of positive skewness.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
   a substrate;
   a GaN compound semiconductor multilayer structure disposed over the substrate; and
   a stress relief layer which is AlN-based and which is disposed between the substrate and the GaN compound semiconductor multilayer structure,
   wherein a surface of the stress relief layer that is in contact with the GaN compound semiconductor multilayer structure has recesses that have a depth of 5 nm or more and that are formed at a number density of $2\times10^{10}$ cm$^{-2}$ or more.

2. The compound semiconductor device according to claim 1, wherein the surface of the stress relief layer that is in contact with the GaN compound semiconductor multilayer structure has recesses that have a depth of 6 nm or more and that are formed at a number density of $2\times10^{10}$ cm$^{-2}$ or more.

3. The compound semiconductor device according to claim 1 wherein each of the recesses has a diameter of 30 nm or more.

4. The compound semiconductor device according to claim 1, wherein each of the recesses has a diameter of 80 nm or more.

5. The compound semiconductor device according to claim 1, wherein a skewness of a roughness curve fitted to the surface of the stress relief layer that is in contact with the GaN compound semiconductor multilayer structure is negative.

6. The compound semiconductor device according to claim 1, wherein the GaN compound semiconductor multilayer structure includes an electron travel layer and an electron supply layer.

7. The compound semiconductor device according to claim 6, further comprising a source electrode, gate electrode, and drain electrode disposed over the electron supply layer.

8. The compound semiconductor device according to claim 1, wherein the substrate is a Si substrate, a SiC substrate, or a sapphire substrate.

9. A power supply system including a compound semiconductor device, the compound semiconductor device comprising:
   a substrate;
   a GaN compound semiconductor multilayer structure disposed over the substrate; and
   a stress relief layer which is AlN-based and which is disposed between the substrate and the GaN compound semiconductor multilayer structure,
   wherein a surface of the stress relief layer that is in contact with the GaN compound semiconductor multilayer structure has recesses that have a depth of 5 nm or more and that are formed at a number density of $2\times10^{10}$ cm$^{-2}$ or more.

10. A high-power amplifier including a compound semiconductor device, the compound semiconductor device comprising:
    a substrate;
    a GaN compound semiconductor multilayer structure disposed over the substrate; and
    a stress relief layer which is AlN-based and which is disposed between the substrate and the GaN compound semiconductor multilayer structure,
    wherein a surface of the stress relief layer that is in contact with the GaN compound semiconductor multilayer structure has recesses that have a depth of 5 nm or more and that are formed at a number density of $2\times10^{10}$ cm$^{-2}$ or more.

* * * * *